US009668208B2

(12) United States Patent
Camuffo et al.

(10) Patent No.: US 9,668,208 B2
(45) Date of Patent: May 30, 2017

(54) OPERATING POINT SETTING OF AN AMPLIFIER

(71) Applicant: Intel Deutschland GmbH, Neubiberg (DE)

(72) Inventors: Andrea Camuffo, Munich (DE); Chi-Tao Goe, Haar (DE); Jan-Erik Mueller, Ottobrunn (DE); Nicholas Shute, Munich (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

(21) Appl. No.: 14/452,168

(22) Filed: Aug. 5, 2014

(65) Prior Publication Data
US 2015/0030056 A1 Jan. 29, 2015

Related U.S. Application Data

(63) Continuation of application No. 12/757,880, filed on Apr. 9, 2010, now abandoned.

(51) Int. Cl.
*H04B 1/40* (2015.01)
*H04W 52/02* (2009.01)
*H04B 1/04* (2006.01)

(52) U.S. Cl.
CPC ...... *H04W 52/0209* (2013.01); *H04B 1/0475* (2013.01); *H04B 1/40* (2013.01); *H04B 2001/0408* (2013.01)

(58) Field of Classification Search
CPC ....... H03F 1/3247; H03F 3/24; H03G 3/3042; H04B 2001/0408; H04B 1/0475; H04B 1/40; H04W 52/0209

USPC ........... 455/127.1, 127.2, 126, 114.3, 115.1, 455/232.1, 234.1, 234.2, 245.1; 375/219
See application file for complete search history.

(56) References Cited

U.S. PATENT DOCUMENTS

| | | | | |
|---|---|---|---|---|
| 6,737,918 B2 * | 5/2004 | Oishi | ........... | H03F 1/3247 330/136 |
| 6,756,844 B2 * | 6/2004 | Nanao | ........... | H03F 1/0266 330/149 |
| 6,867,648 B2 | 3/2005 | Kim et al. | | |
| 7,062,233 B2 | 6/2006 | Huttunen et al. | | |
| 7,076,698 B2 | 7/2006 | Busking | | |
| 7,197,286 B2 | 3/2007 | Ode et al. | | |
| 7,414,470 B2 * | 8/2008 | Okazaki | ........... | H03F 1/32 330/149 |
| 8,326,239 B1 | 12/2012 | Peiris et al. | | |
| 8,331,863 B2 | 12/2012 | Kleider et al. | | |
| 8,334,722 B2 | 12/2012 | Sorrells et al. | | |
| 8,340,602 B1 | 12/2012 | Peiris et al. | | |

(Continued)

FOREIGN PATENT DOCUMENTS

EP 1383235 B1 11/2008

OTHER PUBLICATIONS

"U.S. Appl. No. 12/757,880, Final Office Action mailed Feb. 5, 2014", 12 pgs.

(Continued)

*Primary Examiner* — Philip Sobutka
(74) *Attorney, Agent, or Firm* — Schwegman Lundberg & Woessner, P.A.

(57) ABSTRACT

Embodiments related to the setting of an operating point of an amplifier are described and depicted.

15 Claims, 5 Drawing Sheets

(56) References Cited

U.S. PATENT DOCUMENTS

| | | | | |
|---|---|---|---|---|
| 8,468,244 B2* | 6/2013 | Redlich | ............... | G06Q 10/06 |
| | | | | 705/50 |
| 8,908,751 B2* | 12/2014 | Camuffo | ............... | H03F 1/0255 |
| | | | | 375/224 |
| 2003/0058510 A1 | 3/2003 | Jacobowitz et al. | | |
| 2004/0198263 A1 | 10/2004 | Ode et al. | | |
| 2005/0271173 A1 | 12/2005 | Chou et al. | | |
| 2006/0132237 A1 | 6/2006 | Zochios | | |
| 2007/0190952 A1 | 8/2007 | Waheed et al. | | |
| 2009/0146740 A1 | 6/2009 | Lau et al. | | |
| 2010/0035554 A1 | 2/2010 | Ba et al. | | |
| 2011/0250853 A1* | 10/2011 | Camuffo | ............... | H04B 1/0475 |
| | | | | 455/75 |
| 2012/0071120 A1* | 3/2012 | Pinarello | ............... | H03F 1/0244 |
| | | | | 455/127.5 |

OTHER PUBLICATIONS

"U.S. Appl. No. 12/757,880, Non Final Office Action mailed May 17, 2013", 12 pgs.

"U.S. Appl. No. 12/757,880, Response filed Oct. 17, 2013 to Non Final Office Action mailed May 17, 2013", 13 pgs.

"U.S. Appl. No. 12/757,880, Response filed Dec. 10, 2012 to Restriction Requirement mailed Nov. 8, 2012", 5 pgs.

"U.S. Appl. No. 12/757,880, Restriction Requirement mailed Nov. 8, 2012", 8 pgs.

* cited by examiner

OPERATING POINT SETTING OF AN AMPLIFIER

CLAIM OF PRIORITY AND RELATED APPLICATIONS

This continuation application claims the benefit of priority of Camuffo et al, U.S. patent application Ser. No. 12/757,880, filed on Apr. 9, 2010, and titled, "OPERATING POINT SETTING OF AN AMPLIFIER", which is hereby incorporated by reference herein in its entirety.

BACKGROUND

Many communication systems are based on wireless transmissions. Transceivers of these systems transmit and receive certain information and couple to antennas to convert electrical currents into electromagnetic waves and vice versa. A transceiver's performance with respect to power consumption and transmitter linearity is typically determined by the performance of a radio frequency power amplifier.

A radio frequency amplifier is a circuit to amplify a radio frequency signal such that it can be transmitted wirelessly via an antenna. The amplifier can have only a single amplifying stage or can have multiple amplifying stages.

The radio frequency signal is typically generated by a modulator which modulates a high frequency carrier signal by a baseband signal. The baseband signal represents the information to be transmitted in its non-shifted spectrum. The properties of the carrier signal to be modulated may be amplitude, a frequency and phase or a combination of these.

A high linearity of amplification of a radio frequency signal is important when a radio frequency signal with a modulation of amplitude and phase with a radio frequency carrier signal is amplified. Examples of such signals include signals resulting from data modulation techniques like QAM, QPSK and OFDM. In case of a substantial non-linear operation of the amplifier the output signal spectrum may contain unwanted frequencies and therefore cause other radio channel distortions. It is therefore highly desirable to operate the amplifier circuit according to predetermined linearity requirements.

In addition to linearity particularly for handheld applications like cell phones, PDA's or other wireless mobile devices, the power consumption of the radio frequency amplifier is another performance criterion. Lower power consumption leads directly to longer battery lifetime and is therefore a contribution for saving valuable environmental resources. The operating point (working point) of a radio frequency amplifier is typically set in a way that the amplifier operates clearly in the linear area of its current-voltage characteristic. However, in this case the power consumption of the amplifier is normally quite high.

SUMMARY

A method according to one embodiment includes a generating of a baseband signal and a generating of a radio frequency signal based on the baseband signal. The radio frequency signal is received by an amplifier to generate an amplified radio frequency signal. A down-converted signal is generated based on the amplified radio frequency signal and the operating point of the amplifier is set based on the baseband signal and the down-converted signal.

A device according to one embodiment includes a modulator which is configured to generate a radio frequency signal based on a baseband signal. The device further includes an amplifier configured to receive the radio frequency signal and to output an amplified radio frequency signal. A demodulator is configured to generate a down-converted signal based on the amplified radio frequency signal. Furthermore, the device includes a control circuit which is configured to receive the down-converted signal and the baseband signal to set the operating point of the amplifier.

DETAILED DESCRIPTION

Figure 1:
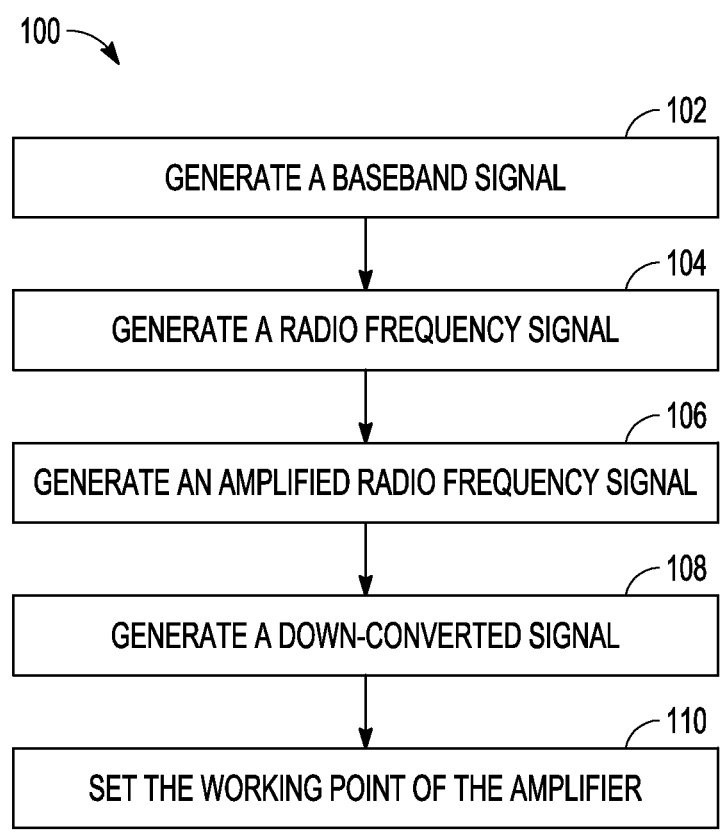
FIG. 1 shows a flow chart diagram according to an embodiment of the present invention.

The following detailed description explains exemplary embodiments of the present invention. The description is not to be taken in a limiting sense, but is made only for the purpose of illustrating the general principles of embodiments of the invention while the scope of protection is only determined by the appended claims.

In the exemplary embodiments shown in the drawings and described below, any direct connection or coupling between functional blocks, devices, components or other physical or functional units shown in the drawings or described herein can also be implemented by an indirect connection or coupling. Functional blocks may be implemented in hardware, firmware, software, or a combination thereof.

Further, it is to be understood that the features of the various exemplary embodiments described herein may be combined with each other, unless specifically noted otherwise.

In the various figures, identical or similar entities, modules, devices etc. may have assigned the same reference number.

Figure 2:
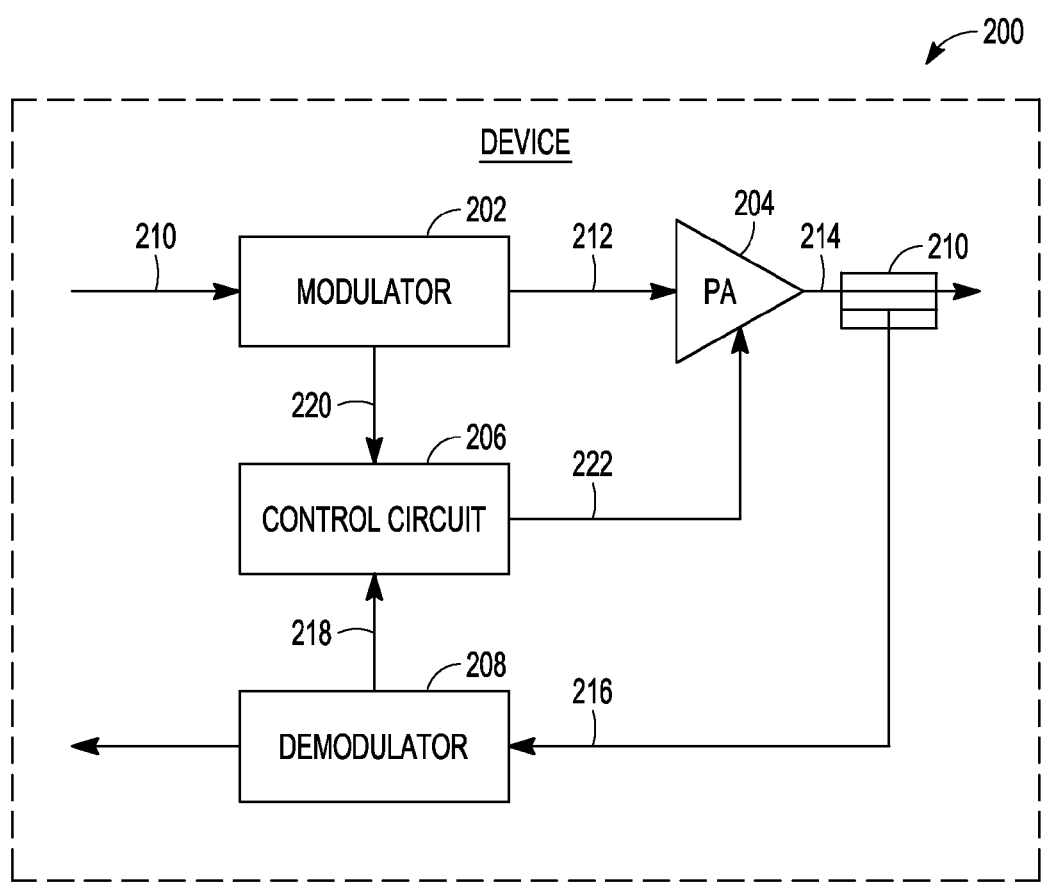
FIG. 2 shows a block diagram of a device according to an embodiment of the present invention.

Referring now to FIG. 2, a device 200 includes according to an embodiment a modulator 202, which may in the technical field sometimes also be referred as an upconverter, having an input to receive a baseband signal 210 at an input of the modulator 202. The device 200 may for example be a transmitter circuit or part of a transmitter circuit used for wireless transmission. However, the device 200 is not limited to such applications and may include other devices in which amplification of signals which are generated based on a baseband signal is provided. The modulator 202 is configured and functions to generate a radio frequency signal 212 based on the baseband signal 210. It may include buffers, amplifiers, attenuators and filters.

In other words, the modulator 202 transforms or shifts the received baseband signal 210 into a signal 212 having a much higher frequency than the received baseband signal 210. The original non-shifted received baseband signal 210 is called a baseband signal. In communication systems, the baseband signals may represent the information to be transmitted like voice, images or data and some overhead data which may be provided e.g. for error coding or channel coding. The baseband signal may be digital, i.e. it is represented by bits or other code symbols. In one embodiment, the modulator 202 may implement a digital modulation wherein digital symbols of the base band signal are transformed into analog waveforms. The analog waveforms may be provided to be compatible with the characteristics of the channel An output of the modulator 202 is coupled to an input of a amplifier 204 to receive the radio frequency signal 212. The amplifier 204 amplifies the received radio frequency signal to provide at an output an amplified radio frequency signal 214. The radio frequency signal 214 is provided via a transmit signal path 215 to further transmission parts or elements such as one or more antennas for transmitting the amplified radio frequency signal 214 wireless to a remote receiver.

In embodiments, the frequency of the radio frequency signals 212 and 214 is high enough to use antennas of proper length to transmit data over a wireless channel. The modulator may shift the baseband signal's spectrum to a higher frequency range. Embodiments provide a mixing of the baseband signal with a carrier signal of the appropriate frequency. Frequency values after modulation may include for example frequencies in the range of several hundreds of MHz to several GHz. The mixing and the properties of the carrier signal used to take over the information of the baseband signal may depend in some embodiments on the modulation technique. For example in some embodiments QAM (Quadrature Amplitude Modulation) may be used. In a further embodiment a polar loop transmitter technique might be used where the amplitude and the phase of a carrier signal is modulated by the baseband signal.

A signal 216 which is based on the amplified radio signal 214 such as a copy of the amplified radio signal 214 is coupled out and provided to a demodulator 208, which may in the technical field sometimes also be referred as a downconverter, via a coupling element 224. The coupling element 224 may be any element or part of a circuit which is capable to directly or indirectly extract the signal from the signal path 215. The coupling element 224 may be a passive element or may be an actively driven element. In embodiments, the coupling element 224 may be a radio frequency coupling element capable of coupling out the amplified radio frequency signals with high frequencies. For example, the coupling element 224 may be a connecting point to the signal path 215 such as a radio frequency connecting point, a transformer utilizing magnetic coupling, a diplexer or duplexer.

The demodulator 208 demodulates the signal 216 and provides at an output of the demodulator 208 a down-converted signal 218 with a much lower frequency than the frequency of the radio frequency signal 216. The demodulator may include buffers, amplifiers, attenuators and filters. The control circuit 206 receives signal 218 generated by the demodulator 208 at a first input of the control circuit 206. The control circuit 206 further receives at a second input of the control circuit 206 a signal 220 which is identical to the baseband signal 210 received by the modulator 202. For example, as shown in FIG. 2, a circuit node in the signal path prior to the modulator 202 may be used to provide a copy of the baseband signal which is transferred to the input of the control circuit. However, it is to be noted that other implementations of providing the baseband signal to the control circuit may be used in other embodiments. For example, the baseband signal may be provided directly from the modulator 202 to the control circuit 206. In other embodiments, only certain critical information or reduced information of the baseband signal may be transferred to the control circuit 206. The control circuit 206 may then reconstruct the baseband signal based on the transferred information.

Having received the signals 218 and 220, the control circuit 206 generates a control signal 222 based on the signals 218 and 220 to set the operating point of the amplifier 204 as will be described in more detail below.

In embodiments, the amplifier 204 may be a transistor based amplifier being capable and controllable to provide adaption of the operating point of the amplifier 204. The transistor based adaptive amplifier may have one or several stages which amplify the radio frequency signal. One or more transistors of the amplifier provide for the amplification and operate according to their current-voltage characteristic. Typically, the amplification is linear only for some operating point regions of the transistor. Non-linearity may be caused for example due to non-linear current-voltage characteristics of the transistors. Embodiments limit distortions caused by the non-linear characteristic to the radio frequency signal by operating the amplifier in the linear region of the transistors' characteristic. In other words, the operating point of the amplifier is set properly such that the amplifier provides linear amplification for all signals received.

The setting of the operating point, i.e. the setting of the bias voltage and/or bias current of the one or more transistors of the amplifier 204 is provided based on the control signal 222 provided from the control circuit 206 to the amplifier 204. The control signal 222 may be a signal indicating in analog or digital form the voltage and/or the current of the operating point set in the one or more transistors of the amplifier 204. In some embodiments, the control signal 222 may be a signal supplying the voltage and/or current to set the operating point of the amplifier's one or more transistors.

As described above, to generate the control signal 222, the device 200 shown in FIG. 2 feeds back the output signal of the amplifier to the demodulator 208 which demodulates the radio frequency signal to generate a down-converted or demodulated output signal used for controlling the setting of the operating point of the amplifier 204. Such a structure utilizing a demodulator for setting the operating point of the amplifier 204 setting of the operating point may be regarded as using a feedback receiver in a feedback loop for setting the operating point. Distinguished from "normal" receiver paths where a signal received from a remote device is downconverted, the feedback receiver demodulates signal 216 which is based on the amplified transmit radio frequency signal which is transmitted by the device 200 to a remote device. The demodulator demodulates in embodiments its input signal 216 based on a carrier signal with the same carrier signal frequency as the modulator 202 uses for up-converting the baseband signal 210 to obtain the radio frequency signal 212. The demodulator may for example filter, attenuate or amplify signal 216. In some embodiments, the modulator 202 and the demodulator 208 may use the same signal for respectively modulating the baseband signal 210 and demodulating the signal 216. A carrier signal generated for example by a signal generator may therefore be distributed to each of the modulator 202 and the demodulator 208.

The output of the demodulator 208 is a down-converted signal 218 which is based on the amplified radio frequency signal 216. In embodiments, an analysis of the difference between the baseband signal and the down converted signal such as a comparison of the down-converted signal 218 with the baseband signals 210 transmitted is used for determining an indication for the quality of the amplified radio frequency signal. The quality of the amplified radio frequency signal may for example be an indication of the quality of the signal spectrum of the amplified radio frequency signal. The quality of the amplified radio frequency signal corresponds to the linearity of the amplifier itself and is therefore a proper indication of the amplifier's linearity.

In some embodiments, the comparison may for example be based on analyzing associated constellation points. A constellation point is a representation of a symbol modulated by a digital modulation scheme such as quadrature amplitude modulation or phase-shift keying. It displays the symbol in the complex plane by its coordinates I and Q, i.e. its in-phase and quadrature components.

By using a constellation point representation the comparison of the baseband signal and the down-converted signal is in some embodiments provided by an error vector magnitude (EVM) calculation. The error vector is a vector in the plane between the ideal constellation point of the baseband symbols and the corresponding constellation point of the downconverted symbols. The operating point may in some embodiments be set by comparing the symbols of the baseband signals 218 and 220 such that the amplitude of the error vector between these two signals is minimized. In some embodiments, a direct evaluation of EVM may be used. Other embodiments may use the calculation of the amplitude distortion (AM/AM) and/or phase distortion (AM/PM) of the amplified radio frequency signal 214 as a measure for the quality of the amplified radio frequency signal 214. In a further embodiment the quality of the amplified radio frequency signal may be determined by the adjacent channel leakage ratio (ACLR) within the amplifier. It is to be noted that the above described embodiments of determining a quality are of exemplary character and that other signal quality indication may be used for determining the operating point of the amplifier 204.

The operating point may be set by setting a bias voltage, for example a collector/drain voltage, and/or a bias current of one or more transistors of the amplifier 204. In a further embodiment, the setting of the operating point may use in addition to the baseband signal and the demodulated amplified radio frequency signal other information such as for example measured values of operating conditions. To this end, one or more sensors to monitor the operating conditions may be provided. The sensors provide output signals to the control circuit 206 which uses the measured data together with the baseband signal 220 and the down-converted signal 218 to provide the control signal 222. The sensors may be used as in the generating of the control signal 222 as an additional parameter to optimize the operating point of the amplifier 204. In one embodiment, the operating temperature is monitored by using temperature sensors that measure the environmental temperature. In other embodiments, voltage and/or current sensors which measure a potential impedance load or antenna mismatch may be used to provide the additional information. The use of additional information may provide a simple and fast adaptive operating point adjustment and may further improve the adaptive setting of the operating point of the amplifier 204.

The values of parameters which set the operating point of the amplifier 204, e.g. bias current and bias voltage are in some embodiments modified simultaneously and in some embodiments modified not simultaneously. In some embodiments only one of the parameters is modified. At the beginning of the transmission one value of the parameter to control the operating point of the amplifier 204 is set. Then the value of the parameter is stepwise modified, e.g. reduced, while the power of the amplified radio frequency signal could substantially be maintained. This parameter might be set high enough to ensure a good linearity of the amplifier behavior so that no unaccepted signal distortions of the amplifier output occur. In embodiments, the stepwise modification of the parameter from one value to another value may be realized in one or more incremental steps. The corresponding step size may change from step to step. In some embodiments the result of the stepwise modification is therefore a quick change of the parameter value while another change of the parameter value may take longer.

The quality of the amplified radio frequency signal is kept above a certain minimum quality threshold by using a scheme as will be described in more detail below. If it is determined that the quality of the amplified radio frequency signal is below a threshold for example by evaluating the EVM between the baseband and the down-converted signal, a modifying of the parameter value is provided such that the quality of the amplified radio frequency signal goes back to a level above the threshold. The threshold may in some embodiments be constant or may in some embodiments be dynamic and set to different level according to the type of modulation being used. However, even if the values of the parameters which control the setting of the operating point are set in a way that the quality is above the threshold, the minimum quality threshold is still met so that distortions caused by a non-linear behavior of the amplifier 204 are excluded.

After modifying of the operating point, the operating point of the amplifier will be kept for a certain time before a new operating point optimization procedure is started, i.e. the stepwise modifying and the further modifying is repeated after the end of a certain time interval.

If the amplifier comprises of multiple stages the described procedure may in some embodiments be provided for each single stage.

A setting of an operating point of an amplifier, such as for example the amplifier 204 of the device 200 as shown in FIG. 2, will now be described with respect to FIG. 1, in a first step 102, a baseband signal is generated. As described above, the baseband signal may in embodiments for example be a baseband signal of a wireless transmission system such as a baseband signal of a mobile phone or a base station. Based on the baseband signal, a radio frequency signal is generated 104. A modulation technique as described herein may be used for generating the radio frequency signal to provide the information of the baseband signal in the radio frequency signal. An amplified radio frequency signal is generated by amplifying the radio frequency signal in the amplifier 106. Then a down-converted signal which is based on the amplified radio frequency signal is generated 108. The operating point of the amplifier is set using the generated down-converted signal 110.

Figure 3:
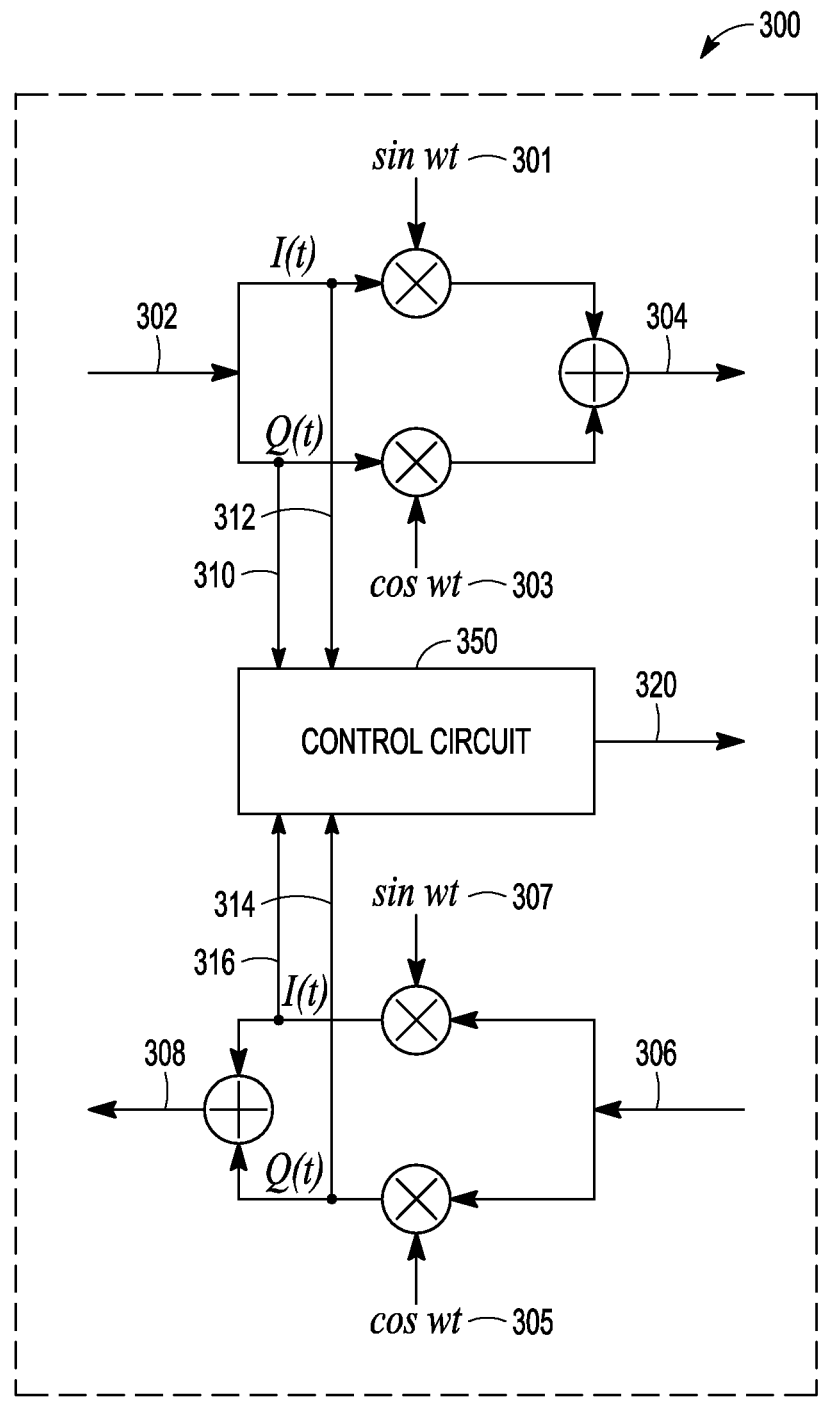
FIG. 3 shows a block diagram of a modulator and demodulator according to an embodiment of the present invention.

FIG. 3 shows an embodiment for setting the operating point of an amplifier which may for example be used in one implementation of the device 200. As shown in FIG. 3, the symbols of the baseband signal 210 are split into their in-phase (I(t)) and quadrature (Q(t)) components which modulate carrier signals 301 and 303 of frequency $\omega$. The sum 304 of the modulated signals is in an embodiment the radio frequency signal 212 which is received by the amplifier 204. Signal 306 is based on the amplified radio frequency signal 214 and is demodulated by mixing with carrier signals 305 and 307 of the same frequency ω. The control circuit 206 receives the I and Q component from the modulators 310 and 312 and from the demodulators 314 and 316 to provide the control signal 222 to set the operating point of the amplifier 204. In the embodiment of FIG. 3, two Q and I basebands signals, and two Q and I downconverted signals are used in the control circuit 206 to generate the control signal 222. In other embodiments using respectively two baseband signals and two demodulated signals, other modulating techniques such as a phase and amplitude modulation technique instead of a I-Q modulation technique may be used for modulating the baseband signal and/or demodulating the amplified radio frequency signal.

In the following exemplary embodiments of a process for setting an operating point of an amplifier are shown. In the embodiments, an amplified radio frequency signal is generated by the amplifier and a value of at least one parameter to control the operating point of the amplifier such as a bias voltage and/or a bias current is set. A stepwise modification from a first value to a second value of the value of the at least one parameter is performed wherein the mean value of the power of the amplified radio frequency signal is substantially maintained.

Figure 4A:
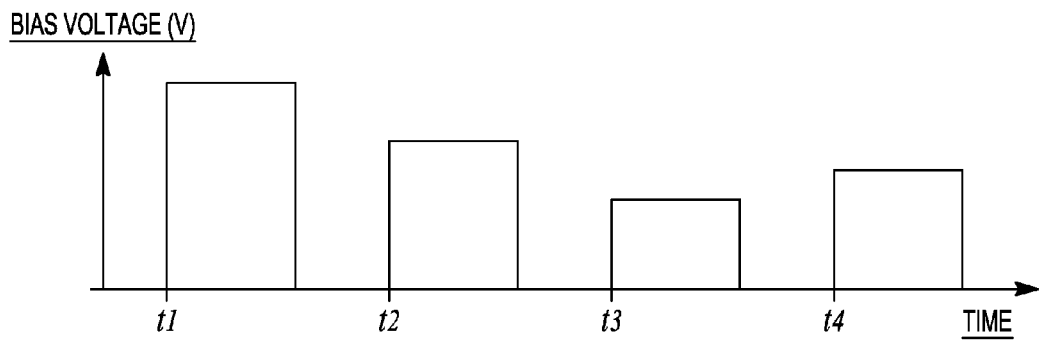
FIG. 4A shows the setting of the bias voltage (DC/DC voltage) such as a drain/collector voltage.
Figure 4B:
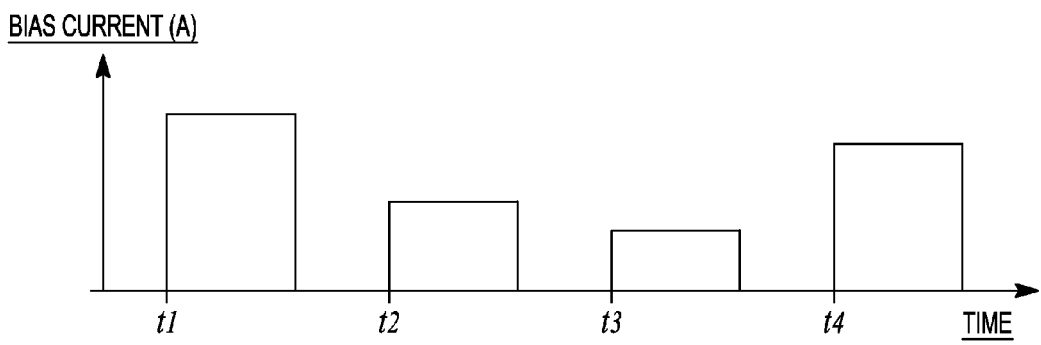
FIG. 4B shows the setting of the bias current for the same time period.
Figure 4C:
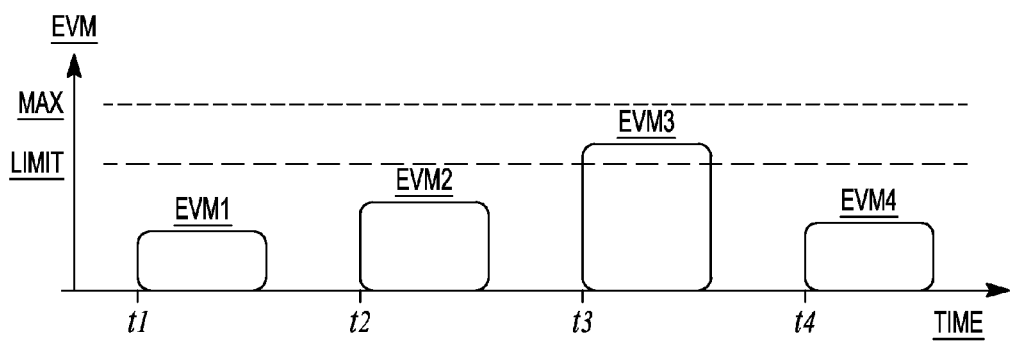
FIG. 4C shows that a determined or measured EVM is at t1 below the threshold "LIMIT".

FIGS. 4a to 4c show timing diagrams of the operating point setting and the quality of the amplified radio frequency signal according to an exemplary embodiment. The characteristics of the timing diagrams illustrate the principal behavior. It is to be understood that the above is only a schematic illustration and that in practical implementations many modifications may be used and other waveforms may be obtained. For example, the changes of the values may be smoother and not as abrupt as shown.

FIG. 4a shows the setting of the bias voltage (DC/DC voltage) such as a drain/collector voltage and FIG. 4b shows the setting of the bias current for the same time period. At t1 both values are set to high values "V1" or "A1" respectively, and the corresponding error vector magnitude (EVM) is illustrated on FIG. 4c and depicted as "EVM1". T1 may for example be the beginning of a new transmission. The operating point is set at the beginning of the new transmission sufficiently high such that a good linearity of the amplified radio frequency signal and therefore a proper transmission of the signal to the remote device is guaranteed.

The high setting of the bias voltage and the bias current results in a relatively low EVM between the baseband signal 220 and the downconverted signal 218, i.e. a very good signal quality.

The value of the resulting EVM is determined and is then compared to a predetermined threshold level "LIMIT". The threshold level "LIMIT" may be regarded as an optimal level for the tradeoff between efficiency of the amplifier and signal quality of the transmitted radio frequency signal. The threshold may be determined depending on different parameters such as the characteristic of the modulation and transmission, environmental conditions and external influences etc. The threshold level "LIMIT" may be fix or may be changed dynamically during transmission. For example, the threshold level "LIMIT" may for example be set according to the type of modulation used.

The threshold level "LIMIT" is determined and set to be sufficiently below a global threshold level MAX which indicates a limit for the signal quality with regards to safe transmission of the signal to a remote device. The global threshold level MAX may for example be a value provided in a system specification.

Based on the comparing, an adaptive scheme is provided which adapts the setting of the operating point by comparing the signal quality of the current amplified radio frequency signal with a threshold level in order to control the signal quality and thereby the linearity of the amplifier 204.

If it is determined that the EVM of the current amplified radio frequency signal is below the threshold level "LIMIT", i.e. the signal quality is above the threshold level, the setting of the operating point is adapted to decrease the signal quality, i.e. to increase the EVM. Otherwise, if the EVM is determined to be below the threshold level "LIMIT", i.e. if the signal quality is below the threshold level, the setting of the operating point is adapted to increase the signal quality, i.e. to decrease the EVM.

As can be seen in FIG. 4c, the determined or measured EVM is at t1 below the threshold "LIMIT". The setting of the operating point is maintained for a certain time period for example multiple transmission time slots until the new setting of the operating point is effectuated at t2. Because "EVM1" is below the predetermined threshold level "LIMIT" the bias voltage and bias current is reduced to the levels "V2" and "A2" shown on t2 and again maintained for a certain time period until t3. In the exemplary described diagram, the new EVM value denoted as "EVM2", is during the time period from t2 to t3 still below the threshold level "LIMIT". This results in a further reduction of the bias current and the bias voltage to values "V3" and "A3" at t3. The step sizes, for example the differences between "1" and "V2" and between "V2" and "V3" may be different. The setting of the operating point is then maintained between t3 and t4. With these settings the new EVM is "EVM3" which is above the threshold level "LIMIT". As a consequence the values for bias current and bias voltage are increased in the next time period following t4, e.g. to values "V4" and "A4" such that the resulting new EVM (EVM4) is below the threshold level "LIMIT". This setting of bias current and bias voltage may be regarded as an optimal setting slightly below the threshold level and may be kept for a fixed or variable time period until the determining of the signal quality and a corresponding adaption of the operating point are periodically repeated. It is to be noted that although the threshold level "LIMIT" has been exceed during the time interval t3 to t4, the setting of the operating point is still sufficiently below the tolerable threshold level defined by "MAX" due to the proper setting of the threshold "LIMIT" sufficiently below the tolerable threshold "MAX".

Figure 5A:
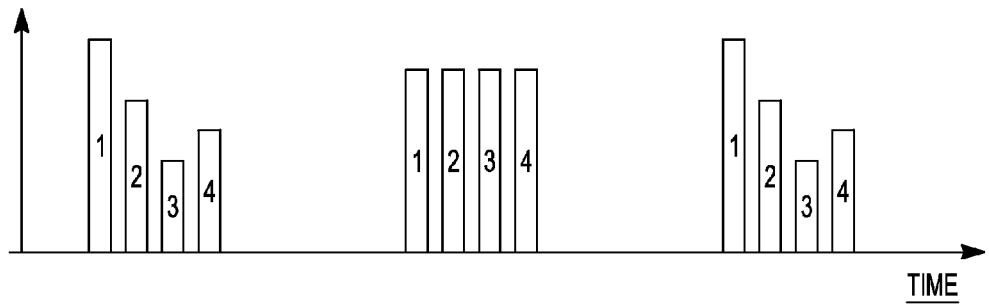
FIGS. 5A, 5B and 5C show another embodiment of an adaptive setting of the operating point
Figure 5B:
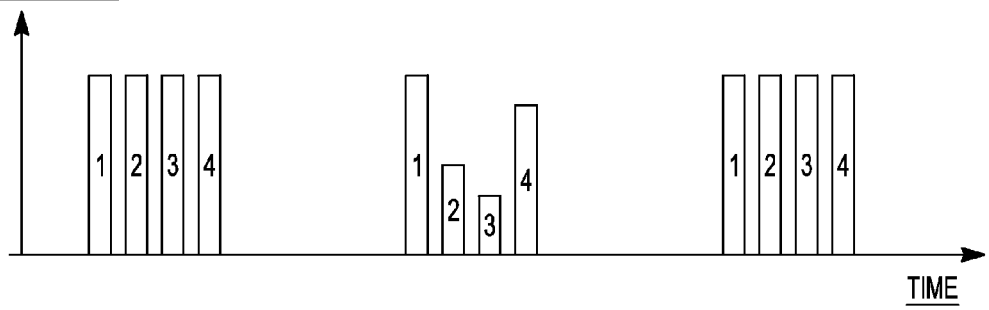
Figure 5C:
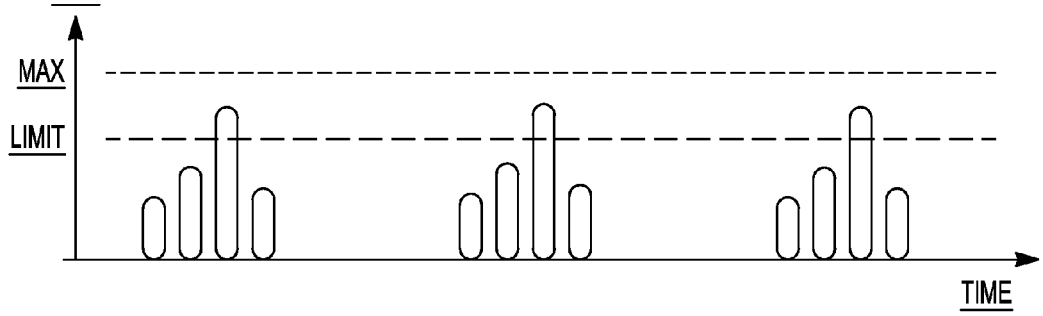

FIGS. 5a to 5c show another embodiment of an adaptive setting of the operating point wherein the timing diagrams of bias current and bias voltage or drain/collector voltage are shown in FIG. 5a and FIG. 5b. and the corresponding principal behavior of the error vector magnitude (EVM) is shown in FIG. 5c. In this embodiment the bias current and the bias voltage are no longer modified or set simultaneously.

FIG. 5a illustrates the values of the bias voltage at different points in time. At t1 the bias voltage is initially set to a value "V1" and the bias current shown in FIG. 5b, is set to a value "A1". The resulting EVM value, shown in FIG. 5c, is denoted as "E1". Because "E1" is greater than the allowed EVM, defined by the threshold "LIMIT", at t2 the bias voltage is reduced to a lower value "V2" while the bias current shown in FIG. 5b is kept constant at "A0". As a consequence the EVM level is increased to "E2". The bias voltage is then even more reduced. As soon as the EVM exceeds the threshold level denoted as "LIMIT", the bias voltage is increased again from "V3" to a value "V4" at t4. Some time later at t5 the bias current starts to decrease from "A1" to "A2" while the bias voltage is kept constant at "V0" as long as EVM is below the defined threshold "LIMIT". At t8 the bias current is increased from "A3" to "A4" because EVM exceeds with "E3" the defined threshold "LIMIT". The step sizes, for example the differences between "A1" and "A2" and between "A5" and "A4" may be different. In all described cases, the EVM is always below the global threshold "MAX". Therefore the quality of the amplified radio signal never falls below a threshold that would cause serious distortions. After some time at t9 the described procedure may start from the beginning.

In the described embodiment of FIGS. 5a-c, the bias current and the bias voltage are alternatively set by respective series of operating point modifications. However other implementations are possible. In some embodiments for example, multiple series of bias current settings may be performed followed by multiple series of bias voltage settings.

The above embodiments may be regarded as a continuously monitoring of the transmitted radio frequency signal (output wave) and therefore a continuously monitoring of the linearity behavior of the amplifier and a stepwise adaption of the operating point to changes of the working condition such as a temperature increase or decrease or a VSWR (voltage standing wave ratio) change. The adaption is provided by the above described embodiments in such a way that the power consumption is always provided at or near the optimal level.

It is to be noted that in the stepwise modification or adaption of the operating point of the amplifier shown in FIGS. 4a-c and 5a-c, the mean value of the power of the amplified radio frequency signal output from the amplifier is maintained overall constant. In other words, the mean value of the power of the amplified radio frequency signal obtained by time integration is maintained constant and is not affected by the settings of the operating point. Only the signal quality of the amplified radio frequency signal is affected by each new setting of a operating point.

While the embodiments described with respect to FIGS. 4a-c and 5a-c have determined and monitored the signal quality by EVM values, it is to be understood that other parameters may be used in other embodiments for indicating the signal quality and performing the adaptive operating point setting. The parameters may be directly or indirectly determined from the baseband signal and the demodulated radio frequency signal. Such parameters include for example a measured ACLS (Adjacent Channel Leakage Ratio) and indirect evaluating of an AM/AM or AM/PM distortion as has been described above. Furthermore, while the embodiments described with respect to FIGS. 4a-c and 5a-c show an adapting of the operating point by varying the bias voltage and the bias current, it is to be noted that in other embodiments the operating point may be adapted or set by varying only the bias current or by varying only the bias voltage while the respectively other parameter.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" used herein are to be interpreted in a sense not only including hardware but also software, firmware or any combinations thereof. The term "data" may be interpreted to include any form of representation such as an analog signal representation, a digital signal representation, a modulation onto carrier signals etc.

It is further to be noted that embodiments described in combination with specific entities may in addition to an implementation in these entity also include one or more implementations in one or more sub-entities or sub-divisions of said described entity. For example, specific embodiments described herein described herein to be implemented in a transmitter, receiver or transceiver may be implemented in subentities such as a chip or a circuit provided in such an entity.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended.

It is further to be noted that methods disclosed in the specification or in the claims may be implemented by a device having means for performing each of the respective steps of these methods.

What is claimed is:

1. A method comprising:
    generating a baseband signal; generating a radio frequency signal based on the baseband signal; receiving the radio frequency signal by an amplifier to generate an amplified radio frequency signal;
    generating a down-converted signal based on the amplified radio frequency signal;
    comparing symbols of the baseband signal with symbols of the down-converted signal to determine an error vector magnitude (EVM), wherein the symbols include an in-phase component and a quadrature component; and setting the operating point of the amplifier based on an analysis of the EVM.

2. The method according to claim 1, wherein the radio frequency signal is generated by modulating a first carrier signal with a first frequency by the baseband signal and wherein the down-converted signal is generated by demodulating a signal derived from the amplified radio frequency signal by using a second carrier signal with the first frequency.

3. The method according to claim 1, wherein setting the operating point comprises setting a bias current and/or a bias voltage of the amplifier based on the analysis of the EMV.

4. The method according to claim 3, wherein setting operating point comprises using data provided by sensors.

5. The method according to claim 4, wherein the sensors are temperature sensors and/or voltage and/or current sensors.

6. The method of claim 1, wherein setting the operating point of the amplifier includes stepwise modifying a value of a parameter of the amplifier from a first value to a second value at a first instance wherein the power of the amplified radio frequency signal is substantially maintained.

7. The method of claim 6, wherein the parameter includes a bias current of the amplifier.

8. The method of claim 6, wherein the parameter includes a bias voltage of the amplifier.

9. The method according to claim 6, including delaying a predetermined interval before generating a second down-converted signal based on the amplified radio frequency signal and setting the operating point of the amplifier based on the baseband signal and the down-converted signal at a second instance.

10. The method of claim 1, including determining whether a quality of the amplified radio frequency signal is below a threshold using the down converted signal, if it is determined that the quality of the amplified radio frequency signal is below the threshold, further modifying the value of the parameter such that the quality of the amplified radio frequency signal is at a level above the threshold.

11. The method according to claim 10, wherein the quality of the amplified radio frequency signal includes a measure of amplitude distortion (AM/AM) and/or phase distortion (AM/PM) of the amplifier.

12. The method according to claim 10, wherein the quality of the amplified radio frequency signal includes a measure of adjacent channel leakage ratio (ACLR) within the amplifier.

13. A device comprising:
a modulator configured to generate a radio frequency signal based on a baseband signal;
an amplifier configured to receive the radio frequency signal and to output an amplified radiofrequency signal;
a demodulator configured to receive the amplified radio frequency signal and to generate a down-converted signal based on the amplified radio frequency signal; and
a control circuit configured to receive the down-converted signal and the baseband signal, to compare symbols of the baseband signal with symbols of the down-converted signal to provide an error vector magnitude (EVM), and to set the operating point of the amplifier based on an analysis of the (EVM), wherein the symbols include an in-phase component and a quadrature component.

14. The device according to claim 13, wherein the modulator is configured to modulate a first carrier signal with a first frequency by the baseband signal and wherein the demodulator is configured to generate the down-converted signal from a modulated second carrier signal with the first frequency.

15. The device according to claim 13, wherein the control circuit is configured to set the operating point of the amplifier by setting bias current and/or a bias voltage of the amplifier.

* * * * *

UNITED STATES PATENT AND TRADEMARK OFFICE
CERTIFICATE OF CORRECTION

PATENT NO. : 9,668,208 B2
APPLICATION NO. : 14/452168
DATED : May 30, 2017
INVENTOR(S) : Camuffo et al.

It is certified that error appears in the above-identified patent and that said Letters Patent is hereby corrected as shown below:

In the Claims

In Column 11, Line 16, in Claim 4, after "setting", insert --the--

In Column 12, Line 37, in Claim 15, after "setting", insert --a--

Signed and Sealed this
Twenty-eighth Day of May, 2019

Andrei Iancu
*Director of the United States Patent and Trademark Office*